US012677528B2

(12) United States Patent
Kim et al.

(10) Patent No.: US 12,677,528 B2
(45) Date of Patent: Jul. 7, 2026

(54) ELECTROLUMINESCENT DISPLAY DEVICE

(71) Applicant: LG DISPLAY CO., LTD., Seoul (KR)

(72) Inventors: Mi-Na Kim, Paju-si (KR); Moon-Sung Kil, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 947 days.

(21) Appl. No.: 17/953,523

(22) Filed: Sep. 27, 2022

(65) Prior Publication Data

US 2023/0217673 A1 Jul. 6, 2023

(30) Foreign Application Priority Data

Dec. 31, 2021 (KR) ........................ 10-2021-0194126

(51) Int. Cl.

*H10K 50/15* (2023.01)
*H10K 50/16* (2023.01)
(Continued)

(52) U.S. Cl.

CPC ............. *H10K 50/15* (2023.02); *H10K 50/16* (2023.02); *H10K 50/18* (2023.02); *H10K 85/615* (2023.02);
(Continued)

(58) Field of Classification Search

CPC .... H10K 50/15; H10K 50/155; H10K 50/156; H10K 85/631; H10K 85/633; H10K 85/636
See application file for complete search history.

(56) References Cited

U.S. PATENT DOCUMENTS 5,639,914 A 6/1997 Tomiyama et al.
5,707,747 A 1/1998 Tomiyama et al.
(Continued)

FOREIGN PATENT DOCUMENTS

CN 102931355 A 2/2013
CN 105609649 A 5/2016
(Continued)

OTHER PUBLICATIONS

Computer-generated English-language translation of CN-113594379-A.*
(Continued)

*Primary Examiner* — Vu A Nguyen
(74) *Attorney, Agent, or Firm* — Morgan, Lewis & Bockius LLP

(57) ABSTRACT

An electroluminescent display device includes a substrate on which a plurality of sub-pixels are defined; a first electrode in each sub-pixel on the substrate; a first hole transporting layer on the first electrode; a second hole transporting layer on the first hole transporting layer; a third hole transporting layer on the second hole transporting layer; a light-emitting material layer on the third hole transporting layer; an electron transporting layer on the light-emitting material layer; and a second electrode on the electron transporting layer, wherein the first hole transporting layer includes a P-type dopant and a first hole transporting material, the second hole transporting layer includes the first hole transporting material, and the third hole transporting layer includes a second hole transporting material, and wherein a total thickness of the first and second hole transporting layers is equal to or greater than a thickness of the third hole transporting layer.

11 Claims, 4 Drawing Sheets

(51) Int. Cl.
*H10K 50/18* (2023.01)
*H10K 85/60* (2023.01)
*H10K 102/00* (2023.01)

(52) U.S. Cl.
CPC ......... *H10K 85/631* (2023.02); *H10K 85/633* (2023.02); *H10K 85/636* (2023.02); *H10K 85/6574* (2023.02); *H10K 85/6576* (2023.02); *H10K 2102/351* (2023.02)

(56) References Cited

U.S. PATENT DOCUMENTS

| | | | |
|---|---|---|---|
| 2013/0264551 | A1 | 10/2013 | Pieh et al. |
| 2015/0311463 | A1 | 10/2015 | Park et al. |
| 2015/0380657 | A1 | 12/2015 | Yokoyama et al. |
| 2016/0072091 | A1 | 3/2016 | Imada et al. |
| 2016/0141510 | A1 | 5/2016 | Sasaki et al. |
| 2016/0163982 | A1 | 6/2016 | Ishihara et al. |
| 2017/0338438 | A1 | 11/2017 | Kwon et al. |
| 2018/0006235 | A1* | 1/2018 | Yokoyama ............ C07C 211/54 |
| 2019/0252613 | A1 | 8/2019 | Song et al. |
| 2019/0378981 | A1 | 12/2019 | Yoo et al. |
| 2020/0388791 | A1* | 12/2020 | Zhang .................. H10K 50/858 |
| 2021/0226086 | A1 | 7/2021 | Lee et al. |
| 2022/0045272 | A1 | 2/2022 | Haketa et al. |
| 2022/0238805 | A1 | 7/2022 | Itoi et al. |

FOREIGN PATENT DOCUMENTS

| | | | | |
|---|---|---|---|---|
| CN | 113594379 | A | * 11/2021 | ............. H10K 71/10 |
| JP | H07126615 | A | 5/1995 | |
| JP | 2001273978 | A | 10/2001 | |
| JP | 2016058519 | A | 4/2016 | |
| JP | 2016111098 | A | 6/2016 | |
| JP | 2021513516 | A | 5/2021 | |
| JP | 2021118358 | A | 8/2021 | |
| KR | 10-2008-0046344 | A | 5/2008 | |
| KR | 10-2013-0113055 | A | 10/2013 | |
| KR | 10-2015-0125158 | A | 11/2015 | |
| KR | 10-2017-0076148 | A | 7/2017 | |
| KR | 10-2017-0132018 | A | 12/2017 | |
| KR | 10-2021-0106037 | A | 8/2021 | |
| WO | 2014/082308 | A1 | 6/2014 | |
| WO | 2014129201 | A1 | 8/2014 | |
| WO | 2020116418 | A1 | 6/2020 | |
| WO | 2021200876 | A1 | 10/2021 | |

OTHER PUBLICATIONS

Office Action (with partial translation) dated Nov. 21, 2023 issued in corresponding Japan Patent Application No. 2022-181449.

First Office Action issued in corresponding Taiwanese Patent Application No. 111139669, dated Jun. 5, 2023.

Office Action Report dated Oct. 17, 2025, issued in German Application No. 10 2022 132 327.7.

* cited by examiner

ELECTROLUMINESCENT DISPLAY DEVICE

CROSS-REFERENCE TO RELATED APPLICATION

The present application claims the priority of Korean Patent Application No. 10-2021-0194126 filed on Dec. 31, 2021, which is hereby incorporated by reference in its entirety.

BACKGROUND

Technical Field

The present disclosure relates to an electroluminescent display device, and more particularly, to an electroluminescent display device including a plurality of hole transporting layers.

Discussion of the Related Art

An electroluminescent display device, which is one of flat panel display devices, has a wide viewing angle as compared with a liquid crystal display device because it is self-luminous and is thin, light weight, and low in power consumption because a backlight unit is not necessary. In addition, an electroluminescent display device is driven by low voltages of direct current (DC) and has a fast response time. An electroluminescent display device is also resistant to external impacts and may be used in a wide range of temperatures because its components are solids. An electroluminescent display device may also be manufactured at low cost.

The electroluminescent display device implements an image through light emitted by a light-emitting diode. The light-emitting diode is an element that injects electric charges into a light-emitting layer formed between a cathode as an electron injection electrode and an anode as a hole injection electrode to thereby form an exciton from an electron and a hole and then emits light due to radiative recombination of the exciton.

The light-emitting diodes have different luminous efficiencies and different lifetimes depending on their structures and/or materials. The difference in luminous efficiencies and lifetimes of the light-emitting diodes has a great influence on the luminous efficiency and lifetime of the electroluminescent display device, and thus research has been conducted to improve the luminous efficiency and lifetime of the light-emitting diode.

SUMMARY

Accordingly, embodiments of the present disclosure are directed to an electroluminescent display device that substantially obviates one or more of the problems due to limitations and disadvantages described above.

An aspect of the present disclosure is to provide an electroluminescent display device with the improved luminous efficiency and lifetime.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an electroluminescent display device comprises a substrate on which a plurality of sub-pixels are defined; a first electrode in each sub-pixel on the substrate; a first hole transporting layer on the first electrode; a second hole transporting layer on the first hole transporting layer; a third hole transporting layer on the second hole transporting layer; a light-emitting material layer on the third hole transporting layer; an electron transporting layer on the light-emitting material layer; and a second electrode on the electron transporting layer, wherein the first hole transporting layer includes a P-type dopant and a first hole transporting material, the second hole transporting layer includes the first hole transporting material, and the third hole transporting layer includes a second hole transporting material, and wherein a total thickness of the first and second hole transporting layers is equal to or greater than a thickness of the third hole transporting layer.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this application, illustrate aspects of the disclosure and together with the description serve to explain various principles of the present disclosure. In the drawings.

DETAILED DESCRIPTION

Reference will now be made in detail to aspects of the disclosure, example embodiments of which are illustrated in the accompanying drawings.

Figure 1:
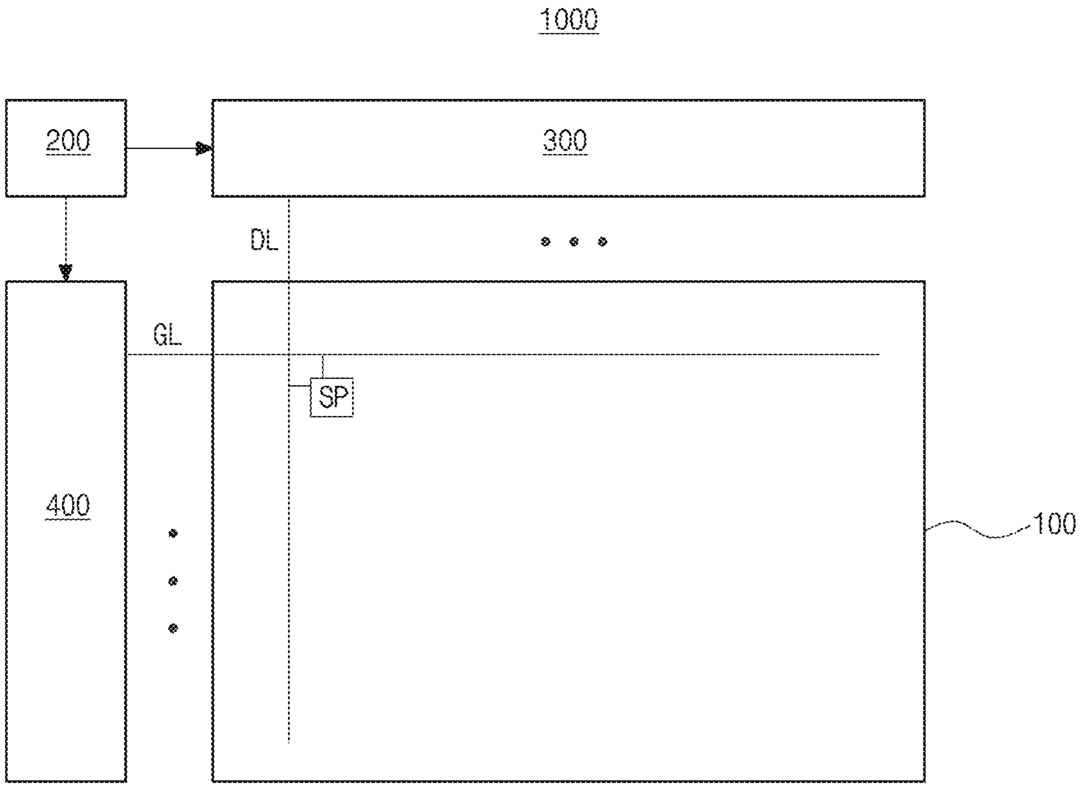
FIG. 1 is a schematic view of an electroluminescent display device according to an embodiment of the present disclosure.

FIG. 1 is a schematic view of an electroluminescent display device according to an embodiment of the present disclosure.

In FIG. 1, the electroluminescent display device 1000 according to an embodiment of the present disclosure includes a display panel 100, a timing control portion 200, a data driving portion 300, and a gate driving portion 400.

The timing control portion 200 generates an image data, a data control signal, and a gate control signal using an image signal and timing signals, which includes a data enable signal, a horizontal synchronization signal, a vertical synchronization signal, and a clock, transmitted from an external system (not shown) such as a graphic card or a television system. The timing control portion 200 transmits the image data and the data control signal to the data driving portion 300 and transmits the gate control signal to the gate driving portion 400.

The data driving portion 300 generates a data voltage of a data signal using the data control signal and the image data transmitted from the timing control portion 200 and applies the data voltage to a data line DL of the display panel 100.

The gate driving portion 400 generates a gate voltage of a gate signal using the gate control signal transmitted from the timing control portion 200 and applies the gate voltage to a gate line GL of the display panel 100.

The gate driving portion 400 can have a gate-in-panel (GIP) type where the gate driving portion 400 is disposed on a substrate of the display panel 100 on which the gate line GL, the data line DL, and a sub-pixel SP are formed.

The display panel 100 displays an image using the gate voltage and the data voltage. To do this, the display panel 100 includes a plurality of sub-pixels SP, a plurality of gate lines GL, and a plurality of data lines DL, which are disposed in a display area. The plurality of gate lines GL and the plurality of data lines DL cross each other to define the plurality of sub-pixels SP, and each sub-pixel SP is connected to one gate line GL and one data line DL.

Each sub-pixel SP expresses one color, and several sub-pixels SP expressing different colors constitute one pixel. One pixel can include three sub-pixels SP. For example, one pixel can include red, green, and blue sub-pixels.

A light-emitting diode is provided in each sub-pixel SP. In addition, each sub-pixel SP can include a plurality of thin film transistors such as a switching thin film transistor and a driving thin film transistor and a storage capacitor, and this will be described in detail with reference to FIG. 2.

Figure 2:
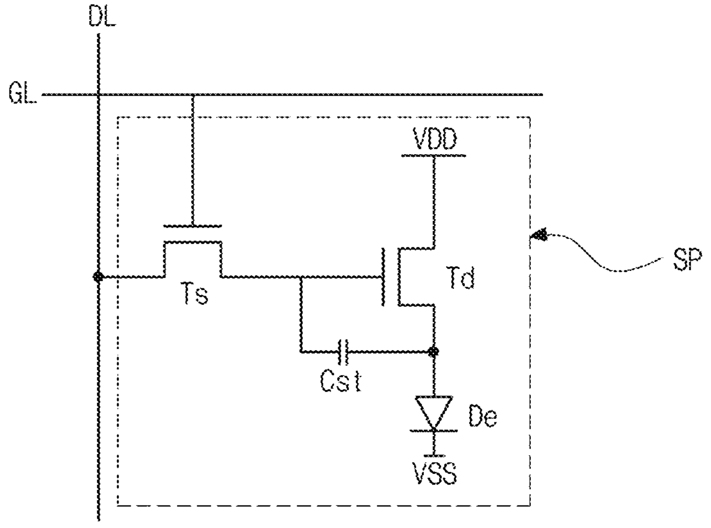
FIG. 2 is a circuit diagram of one sub-pixel of the electroluminescent display device according to the embodiment of the present disclosure.

FIG. 2 is a circuit diagram of one sub-pixel of the electroluminescent display device according to the embodiment of the present disclosure.

In FIG. 2, each sub-pixel of the electroluminescent display device according to the embodiment of the present disclosure is defined by the gate line GL and the data line DL crossing each other, and a switching thin film transistor Ts, a driving thin film transistor Td, a storage capacitor Cst, and a light-emitting diode De are formed in each sub-pixel SP.

For example, the switching thin film transistor Ts and the driving thin film transistor Td can be a P-type. However, the present disclosure is not limited thereto, and the switching thin film transistor Ts and the driving thin film transistor Td can be an N-type.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts and a source electrode of the driving thin film transistor Td is connected to a high potential voltage VDD. An anode of the light-emitting diode De is connected to a drain electrode of the driving thin film transistor Td, and a cathode of the light-emitting diode De is connected to a low potential voltage VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode De is controlled, thereby displaying an image. The light-emitting diode De emits light due to the current supplied through the driving thin film transistor Td from the high potential voltage VDD.

Namely, the amount of the current flowing through the light-emitting diode De is proportional to the magnitude of the data signal, and the intensity of light emitted by the light-emitting diode De is proportional to the amount of the current flowing through the light-emitting diode De. Thus, the sub-pixels SP show different gray levels depending on the magnitude of the data signal, and as a result, the electroluminescent display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode De to be constant and the gray level shown by the light-emitting diode De to be maintained until a next frame.

Meanwhile, one or more thin film transistors and/or capacitors can be added in the sub-pixel SP in addition to the switching and driving thin film transistors Ts and Td and the storage capacitor Cst.

For example, in the electroluminescent display device, the driving thin film transistor Td is turned on for a relatively long time while the data signal is applied to the gate electrode of the driving thin film transistor Td and the light-emitting diode De emits light to thereby display the gray level. The driving thin film transistor Td can deteriorate due to application of the data signal for a long time. Therefore, the mobility and/or threshold voltage Vth of the driving thin film transistor Td are changed, and thus the sub-pixel SP of the electroluminescent display device displays a different gray level with respect to the same data signal. This causes non-uniform luminance, thereby lowering the image quality of the electroluminescent display device.

Accordingly, to compensate the change of the mobility and/or threshold voltage of the driving thin film transistor Td, at least one sensing thin film transistor and/or capacitor for sensing a voltage change can be further added in the sub-pixel SP. The sensing thin film transistor and/or capacitor can be connected to a reference line for applying a reference voltage and outputting a sensing voltage.

A configuration of the electroluminescent display device will be described in detail with reference to FIG. 3.

Figure 3:
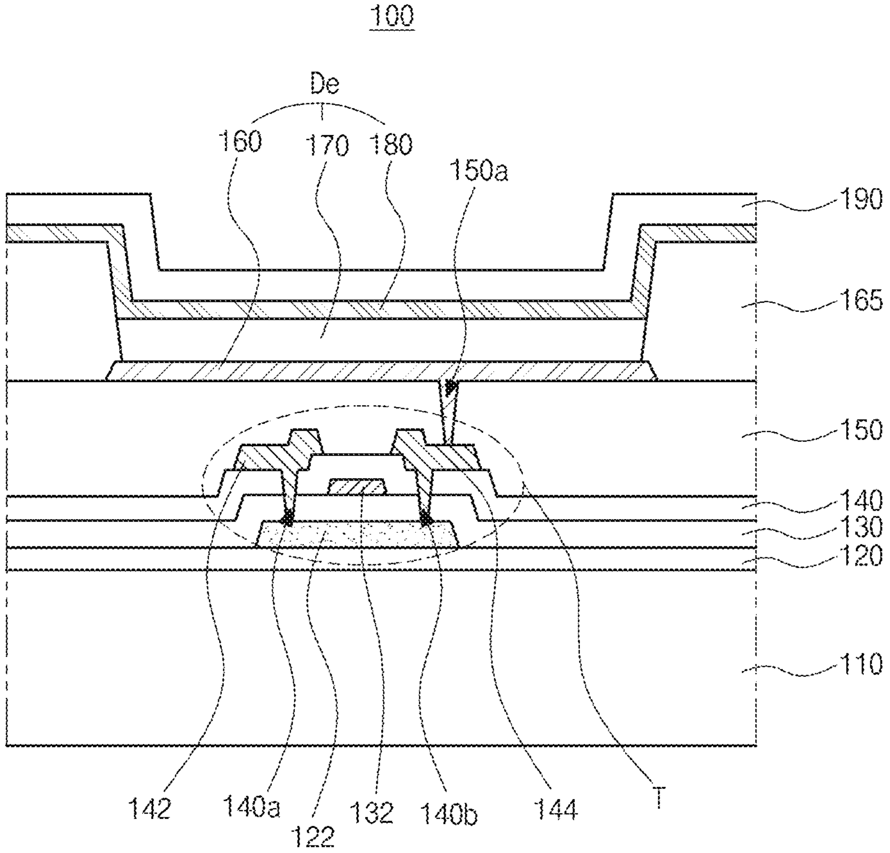
FIG. 3 is a schematic cross-sectional of the electroluminescent display device according to the embodiment of the present disclosure and shows one sub-pixel.

FIG. 3 is a schematic cross-sectional of the electroluminescent display device according to the embodiment of the present disclosure and shows one sub-pixel.

As shown in FIG. 3 in the electroluminescent display device according to the embodiment of the present disclosure, a buffer layer 120 is formed on a substrate 110. The buffer layer 120 is disposed substantially on an entire surface of the substrate 110. The substrate 110 can be a glass substrate or a plastic substrate. For example, polyimide can be used as the plastic substrate, but is not limited thereto. The buffer layer 120 can be formed of an inorganic material, such as silicon oxide ($SiO_2$) or silicon nitride (SiNx), and can be a single layer or multiple layers.

A patterned semiconductor layer 122 is formed on the buffer layer 120. The semiconductor layer 122 can be formed of an oxide semiconductor material, and in this case, a light-shielding pattern can be further formed under the semiconductor layer 122. The light-shielding pattern can block light incident on the semiconductor layer 122 and can prevent the semiconductor layer 122 from deteriorating due to the light. Alternatively, the semiconductor layer 122 can be formed of polycrystalline silicon, and both ends of the semiconductor layer 122 can be doped with impurities.

A gate insulation layer 130 of an insulating material is formed on the semiconductor layer 122 substantially over the entire surface of the substrate 110. The gate insulation layer 130 can be formed of an inorganic insulating material such as silicon oxide ($SiO_2$) or silicon nitride (SiNx). When the semiconductor layer 122 is made of an oxide semiconductor material, the gate insulation layer 130 can be formed of silicon oxide ($SiO_2$). Alternatively, when the semiconductor layer 122 is made of polycrystalline silicon, the gate insulation layer 130 can be formed of silicon oxide ($SiO_2$) or silicon nitride (SiNx).

A gate electrode 132 of a conductive material such as metal is formed on the gate insulation layer 130 corresponding to the center of the semiconductor layer 122. In addition, a gate line and a first capacitor electrode can be formed on the gate insulation layer 130. The gate line extends in a first direction, and the first capacitor electrode is connected to the gate electrode 132.

In the embodiment of the present disclosure, the gate insulation layer 130 is formed substantially over the entire surface of the substrate 110. However, the gate insulation layer 130 can be patterned to have the same shape as the gate electrode 132.

An interlayer insulation layer 140 made of an insulating material is formed on the gate electrode 132 substantially over the entire surface of the substrate 110. The interlayer insulation layer 140 can be formed of an inorganic insulating material such as silicon oxide ($SiO_2$) or silicon nitride (SiNx). Alternatively, the interlayer insulation layer 140 can be formed of an organic insulating material such as photo acryl or benzocyclobutene.

The interlayer insulation layer 140 has first and second contact holes **140*a* and 140*b* exposing top surfaces of both ends of the semiconductor layer 122. The first and second contact holes 140*a* and 140*b* are disposed at both sides of the gate electrode 132 and spaced apart from the gate electrode 132. The first and second contact holes 140*a* and 140*b* are also formed in the gate insulation layer 130. Alternatively, when the gate insulation layer 130 is patterned to have the same shape as the gate electrode 132, the first and second contact holes 140*a* and 140*b* are formed only in the interlayer insulation layer 140**.

Source and drain electrodes 142 and 144 of a conductive material such as metal are formed on the interlayer insulation layer 140. In addition, a data line, a power supply line and a second capacitor electrode can be further formed on the interlayer insulation layer 140.

The source and drain electrodes 142 and 144 are spaced apart from each other with the gate electrode 132 positioned therebetween and are in contact with both ends of the semiconductor layer 122 through the first and second contact holes **140*a* and 140*b*, respectively. The data line extends in a second direction and crosses the gate line to thereby define a pixel region corresponding to each sub-pixel. The power supply line for supplying a high potential voltage is spaced apart from the data line. The second capacitor electrode is connected to the drain electrode 144. The second capacitor electrode overlaps the first capacitor electrode to thereby constitute a storage capacitor with the interlayer insulation layer 140 therebetween as a dielectric. Alternatively, the first capacitor electrode can be connected to the drain electrode 144, and the second capacitor electrode can be connected to the gate electrode 132**.

The semiconductor layer 122, the gate electrode 132, and the source and drain electrodes 142 and 144 form a thin film transistor T. The thin film transistor T has a coplanar structure in which the gate electrode 132 and the source and drain electrodes 142 and 144 are located at the same side with respect to the semiconductor layer 122.

Alternatively, the thin film transistor T can have an inverted staggered structure in which the gate electrode and the source and drain electrodes are located at different sides with respect to the semiconductor layer. That is, the gate electrode can be disposed under the semiconductor layer, and the source and drain electrodes can be disposed over the semiconductor layer. In this case, the semiconductor layer can be formed of oxide semiconductor or amorphous silicon.

The thin film transistor T corresponds to a driving thin film transistor Td of FIG. 2, and a switching thin film transistor Ts of FIG. 2 having the same structure as the thin film transistor T can be further formed in each sub-pixel on the substrate 110. The gate electrode 132 of the thin film transistor T can be connected to a drain electrode of the switching thin film transistor Ts of FIG. 2, and the source electrode 142 of the thin film transistor T is connected to the power supply line. In addition, a gate electrode and a source electrode of the switching thin film transistor Ts of FIG. 2 can be connected to the gate line and the data line, respectively.

Further, a sensing thin film transistor having the same structure of the thin film transistor T can be further formed in each sub-pixel on the substrate 110, but the present disclosure is not limited thereto.

An overcoat layer 150 of an insulating material is formed on the source and drain electrodes 142 and 144 substantially over the entire surface of the substrate 110. The overcoat layer 150 can be formed of an organic insulating material such as photo acryl or benzocyclobutene. The overcoat layer 150 can have a flat top surface.

Meanwhile, an insulation layer of an inorganic insulating material such as silicon oxide ($SiO_2$) or silicon nitride (SiNx) can be further formed under the overcoat layer 150, that is, between the thin film transistor T and the overcoat layer 150.

The overcoat layer 150 has a drain contact hole **150*a* exposing the drain electrode 144. The drain contact hole 150*a* can be spaced apart from the second contact hole 140*b*. Alternatively, the drain contact hole 150*a* can be disposed right over the second contact hole 140*b***.

A first electrode 160 is formed on the overcoat layer 150 and formed of a conductive material having a relatively high work function. The first electrode 160 is disposed in each sub-pixel and is in contact with the drain electrode 144 through the drain contact hole **150*a*. For example, the first electrode 160** can be formed of a transparent conductive material such as indium tin oxide (ITO) or indium zinc oxide (IZO), but is not limited thereto.

The electroluminescent display device according to the embodiment of the present disclosure can be a top emission type in which light of a light-emitting diode De is output toward a direction opposite the substrate 110. Accordingly, the first electrode 160 can further include a reflective electrode or a reflective layer formed of a metal material having a relatively high reflectance below the transparent conductive material. For example, the reflective electrode or reflective layer can be formed of an aluminum-palladium-copper (APC) alloy, silver (Ag) or aluminum (Al). The first electrode 160 can have a triple-layer structure of ITO/APC/ITO, ITO/Ag/ITO or ITO/Al/ITO, but is not limited thereto.

A bank 165 of an insulating material is formed on the first electrode 160. The bank 165 overlaps and covers edges of the first electrode 160 and exposes a central portion of the first electrode 160.

At least a top surface of the bank 165 is hydrophobic, and a side surface of the bank 165 can be hydrophobic or hydrophilic. The bank 165 can be formed of an organic insulating material having a hydrophobic property. Alternatively, the bank 165 can be formed of an organic insulating material having a hydrophilic property and can be subjected to a hydrophobic treatment.

In the present disclosure, the bank 165 has a single-layer structure. However, the bank 165 can have a double-layer structure. That is, the bank 165 can have a double-layer structure including a hydrophilic bank of a lower side and a hydrophobic bank of an upper side.

Next, a light-emitting layer 170 is formed on the first electrode 160 exposed by the bank 165.

Although not shown in the figure, the light-emitting layer 170 can include a first charge auxiliary layer, a light-emitting material layer, and a second charge auxiliary layer sequentially disposed over the first electrode 160. The light-emitting material layer can be formed of any one of red, green and blue luminescent materials, but is not limited thereto. The luminescent material can be an organic luminescent material such as a phosphorescent compound or a fluorescent compound or can be an inorganic luminescent material such as a quantum dot.

The first charge auxiliary layer can be a hole auxiliary layer, and the hole auxiliary layer can include at least one of a hole injecting layer (HIL) and a hole transporting layer (HTL). In addition, the second charge auxiliary layer can be an electron auxiliary layer, and the electron auxiliary layer can include at least one of an electron injecting layer (EIL) and an electron transporting layer (ETL). However, the present disclosure is not limited thereto.

The light-emitting layer 170 can be formed through a solution process or an evaporation process. When the light-emitting layer 170 is formed through the solution process, a height of the light-emitting layer 170 in the region adjacent to the bank 165 can rise as it gets closer to the bank 165.

A second electrode 180 of a conductive material having a relatively low work function is formed on the light-emitting layer 170 substantially over the entire surface of the substrate 110. The second electrode 180 can be formed of aluminum (Al), magnesium (Mg), silver (Ag), or an alloy thereof. The second electrode 180 has a relatively thin thickness such that light from the light-emitting layer 170 can be transmitted therethrough. Alternatively, the second electrode 180 can be formed of a transparent conductive material such as indium-gallium-oxide (IGO), but is not limited thereto.

The first electrode 160, the light-emitting layer 170, and the second electrode 180 constitute a light-emitting diode De. The first electrode 160 can serve as an anode, and the second electrode 180 can serve as a cathode, but is not limited thereto.

As described above, the electroluminescent display device according to the embodiment of the present disclosure can be a top emission type display device in which light from the light-emitting layer 170 of the light-emitting diode De is output toward a direction opposite the substrate 110, that is, output to the outside through the second electrode 180. The top emission type display device can have a wider emission area than a bottom emission type display device of the same size, to thereby improve luminance and reduce power consumption.

A capping layer 190 is formed on the second electrode 180 substantially over the entire surface of the substrate 110. The capping layer 190 can be formed of an insulating material having a relatively high refractive index. The wavelength of light traveling along the capping layer 190 can be amplified by surface plasma resonance, and thus the intensity of the peak can be increased, thereby improving the light efficiency in the top emission type electroluminescent display device. For example, the capping layer 190 can be formed as a single layer of an organic layer or an inorganic layer or formed as organic/inorganic stacked layers.

In addition, a protective layer and/or an encapsulation layer can be formed on the capping layer 190 substantially over the entire surface of the substrate 110 to block moisture or oxygen introduced from the outside, thereby protecting the light-emitting diode De.

The structure of the light-emitting layer 170 of the electroluminescent display device according to the embodiment of the present disclosure will be described in more detail with reference to FIG. 4.

Figure 4:
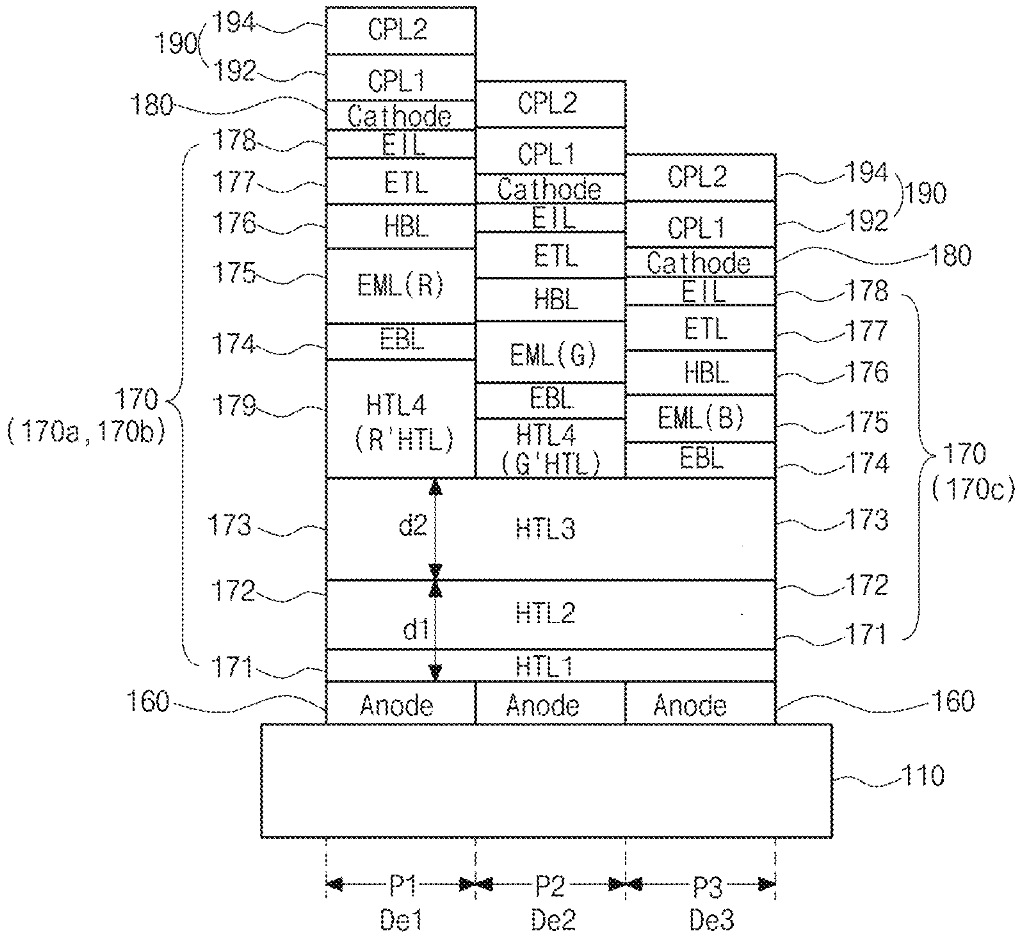
FIG. 4 is a schematic view of a pixel of an electroluminescent display device according to a first embodiment of the present disclosure.

FIG. 4 is a schematic view of a pixel of an electroluminescent display device according to a first embodiment of the present disclosure.

As shown in FIG. 4, in the electroluminescent display device according to the first embodiment of the present disclosure, one pixel includes first, second, and third sub-pixels P1, P2, and P3. The first, second, and third sub-pixels P1, P2, and P3 are defined on a substrate 110, and first, second, and third light-emitting diodes De1, De2, and De3 are formed in the first, second, and third sub-pixels P1, P2, and P3, respectively. Each of the first, second, and third light-emitting diodes De1, De2, and De3 includes a first electrode 160, a light-emitting layer 170, and a second electrode 180. Each of the first, second, and third sub-pixels P1, P2, and P3 can have a cross-sectional structure of FIG. 3.

Here, the first, second, and third sub-pixels P1, P2, and P3 can correspond to red, green, and blue sub-pixels R, G, and B, respectively, and the first, second, and third light-emitting diodes De1, De2, and De3 can be red, green, and blue light-emitting diodes, respectively.

More specifically, the first electrode 160 is formed in each of the first, second, and third sub-pixels P1, P2, and P3 on the substrate 110. The first electrode 160 servers as an anode supplying holes and may be formed of a conductive material having relatively high work function. For example, the first electrode 160 may be formed of a transparent conductive material such as ITO or IZO.

Meanwhile, the electroluminescent display device can be a top emission type in which light from the light-emitting layer 170 is output to the outside through the second electrode 180, and a reflective electrode or a reflective layer can be further formed below the first electrode 160. For example, the reflective electrode or the reflective layer can be formed of silver (Ag) or aluminum-palladium-copper (APC).

Alternatively, the first electrode 170 can include a reflective electrode. In this case, the first electrode 160 can have a stacked structure of ITO/APC/ITO or ITO/Ag/ITO.

The first electrode 160 is formed separately for each of the first, second, and third sub-pixels P1, P2, and P3.

Next, the light-emitting layer 170 is formed on the first electrode 160 in each of the first, second, and third sub-pixels P1, P2, and P3.

The light-emitting layer 170 includes a first hole transporting layer 171, a second hole transporting layer 172, a third hole transporting layer 173, an electron blocking layer 174, a light-emitting material layer 175, a hole blocking layer 176, an electron transporting layer 177, and an electron injecting layer 178 sequentially disposed over the first electrode 160.

Here, each the light-emitting layers 170*a* and 170*b* of the first and second sub-pixels P1 and P2 further includes a fourth hole transporting layer 179 compared to the light-emitting layer 170*c* of the third sub-pixel P3. The fourth hole transporting layer 179 is disposed between the third hole transporting layer 173 and the electron blocking layer 174.

That is, each of the light-emitting layers 170*a* and 170*b* of the first and second sub-pixels P1 and P2 includes the first hole transporting layer 171, the second hole transporting layer 172, the third hole transporting layer 173, the fourth hole transporting layer 179, the electron blocking layer 174, the light-emitting material layer 175, the hole blocking layer 176, the electron transporting layer 177, and the electron injecting layer 178 sequentially disposed over the first electrode 160. The light-emitting layer 170*c* of the third sub-pixel P3 includes the first hole transporting layer 171, the second hole transporting layer 172, the third hole transporting layer 173, the electron blocking layer 174, the light-emitting material layer 175, the hole blocking layer 176, the electron transporting layer 177, and the electron injecting layer 178 sequentially disposed over the first electrode 160.

The first hole transporting layer (HTL1) 171 serves to smoothly inject holes from the first electrode 160 into the light-emitting material layer 175. Here, the first hole transporting layers 171 of the first, second, and third sub-pixels P1, P2, and P3 can be connected to each other. Alternatively, the first hole transporting layers 171 of the first, second, and third sub-pixels P1, P2, and P3 can be separated from each other. The first hole transporting layer 171 can include a first hole transporting material and a P-type dopant.

Meanwhile, a hole injecting layer (HIL) can be further provided between the first electrode 160 and the first hole transporting layer 171.

The second hole transporting layer (HTL2) 172 and the third hole transporting layer (HTL3) 173 on the first hole transporting layer 171 serve to smoothly transport the holes from the first electrode 160 to the light-emitting material layer 175. Here, the second hole transporting layers 172 of the first, second, and third sub-pixels P1, P2, and P3 can be connected to each other, and the third hole transporting layers 173 of the first, second, and third sub-pixels P1, P2, and P3 can be connected to each other. Alternatively, the second hole transporting layers 172 of the first, second, and third sub-pixels P1, P2, and P3 can be separated from each other, and the third hole transporting layers 173 of the first, second, and third sub-pixels P1, P2, and P3 can be connected to each other.

A sum d1 of a thickness of the first hole transporting layer 171 and a thickness of the second hole transporting layer 172 is equal to a thickness d2 of the third hole transporting layer 173. That is, a total thickness d1 of the first and second hole transporting layers 171 and 172 and the thickness d2 of the third hole transporting layer 173 has a ratio of 1:1.

The second and third hole transporting layers 172 and 173 includes different materials. The second hole transporting layer 172 can include the first hole transporting material, and the third hole transporting layer 173 can include a second hole transporting material. Accordingly, the first and second hole transporting layers 171 and 172 can include the same material.

The second hole transporting material has a higher refractive index than the first hole transporting material. In this case, the second hole transporting material has the refractive index of 2.1 or more at a wavelength of 460 nm.

The first hole transporting material and the second hole transporting material may include an amine compound. Specifically, the first hole transporting material may include a mono-amine compound. For example, the first hole transporting material may be selected from compounds expressed by the following Formula 1 to Formula 7, but is not limited thereto.

[Formula 1]

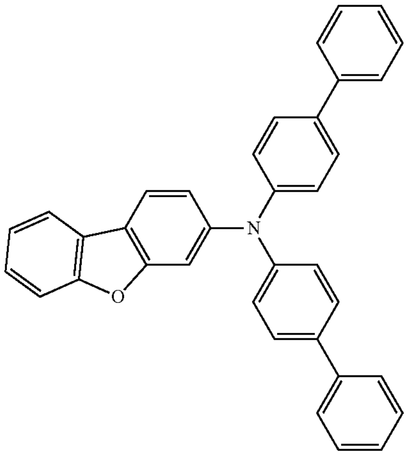

[Formula 2]

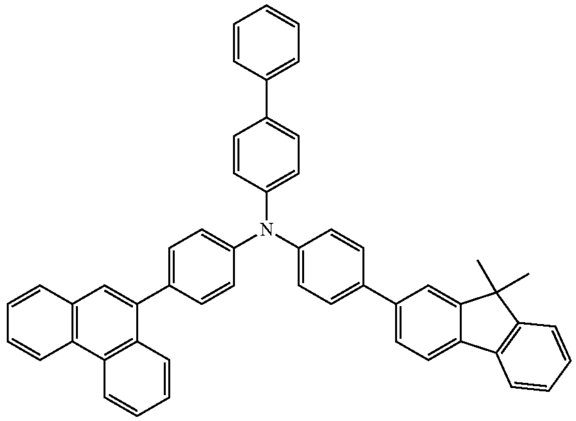

-continued
[Formula 3]
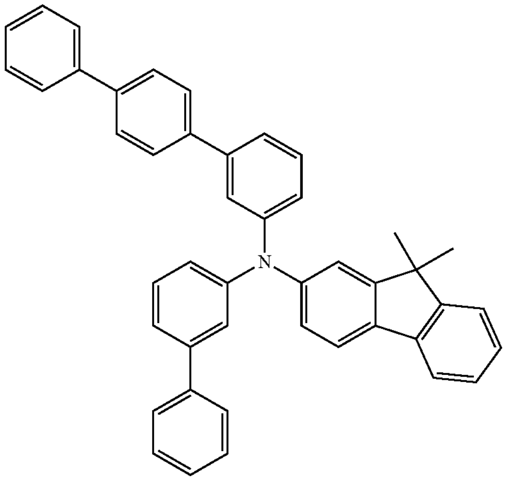
[Formula 4]
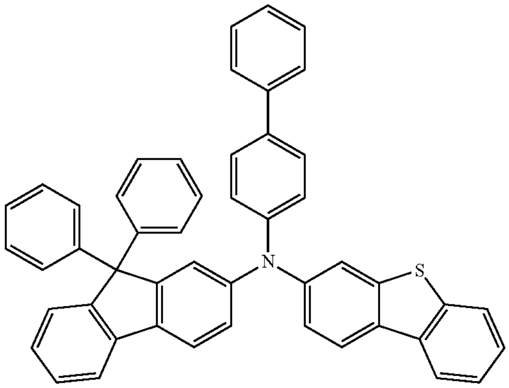
[Formula 5]
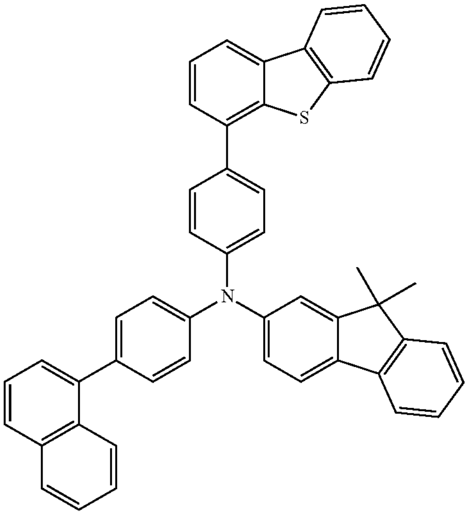
-continued
[Formula 6]
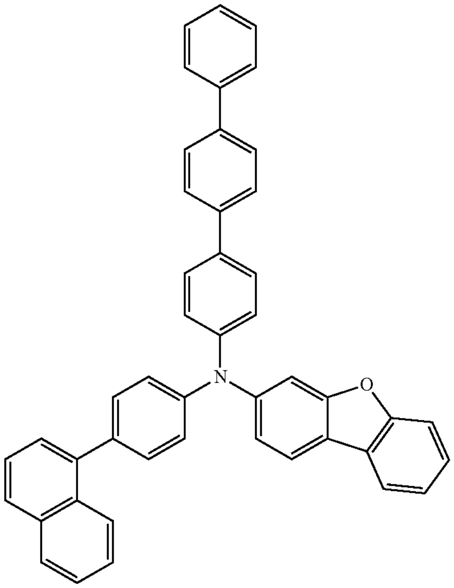
[Formula 7]
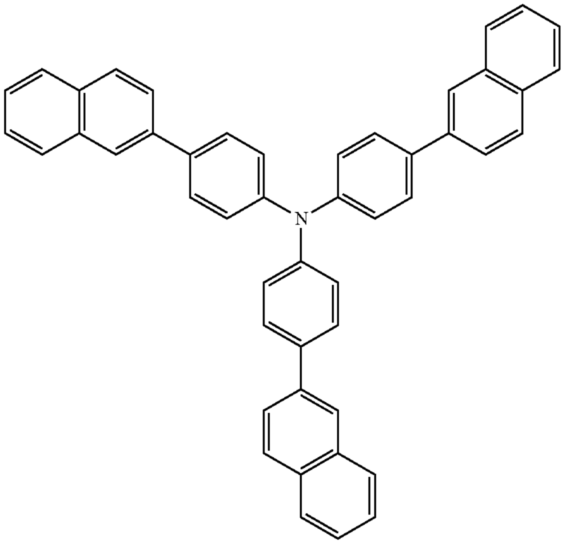
In addition, the second hole transporting material may include a di-amine compound. For example, the second hole transporting material may be selected from compounds expressed by the following Formula 8 to Formula 13, but is not limited thereto.

[Formula 8]

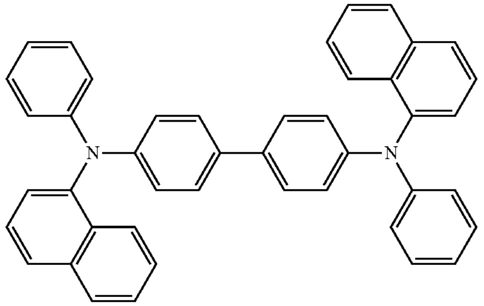

[Formula 9]

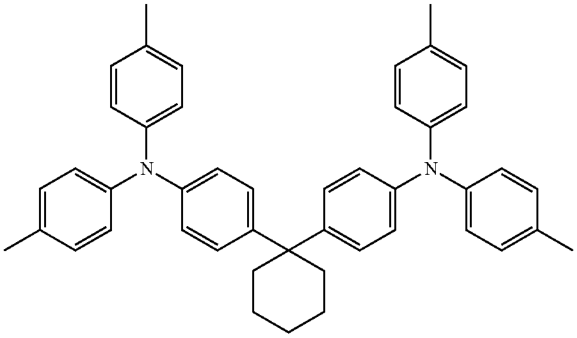

[Formula 10]

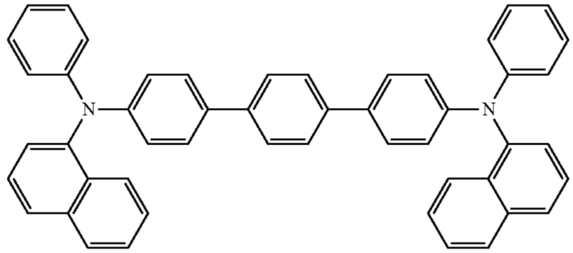

[Formula 11]

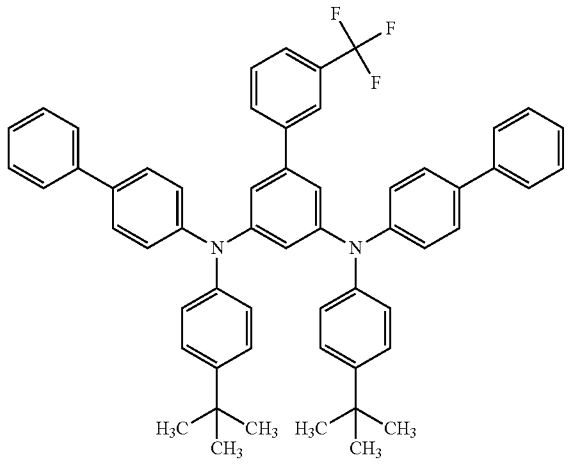

-continued

[Formula 12]

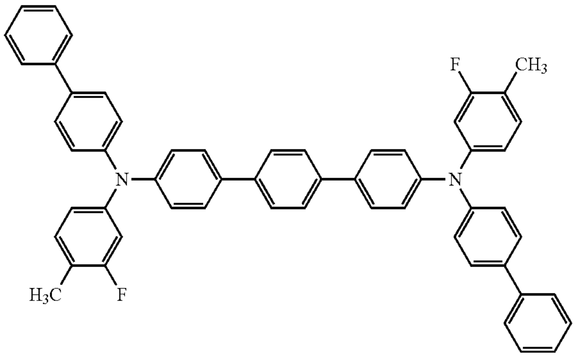

[Formula 13]

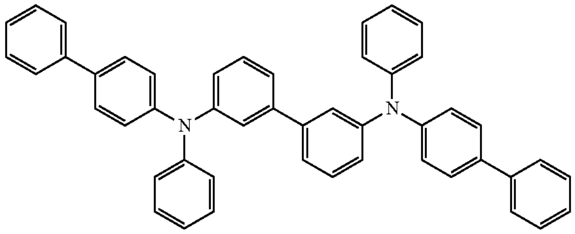

Meanwhile, the P-type dopant may be selected from compounds expressed by the following Formula 14 and Formula 15, but is not limited thereto.

[Formula 14]

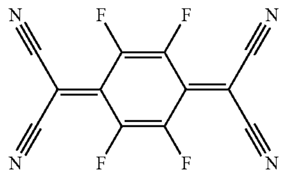

[Formula 15]

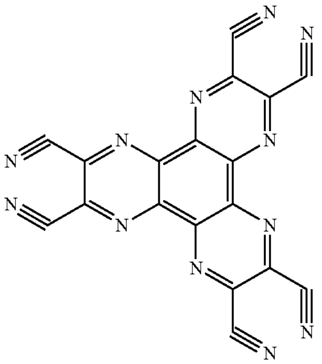

Next, the fourth hole transporting layer (HTL4) 179 on the third hole transporting layer 173 in the first and second sub-pixels P1 and P2 serves as an optical auxiliary layer and controls a distance between the first and second electrodes 160 and 180, that is, a thickness of the light-emitting layer 170. Accordingly, the luminous efficiency can be further increased by the micro-cavity effect in which light emitted from the light-emitting layer 170 causes interference between the first and second electrodes 160 and 180.

Here, a thickness of the fourth hole transporting layer (R' HTL) 179 of the first sub-pixel P1 is greater than a thickness of the fourth hole transporting layer (G' HTL) 179 of the second sub-pixel P2. Accordingly, the thickness of the light-emitting layer 170*b* of the second sub-pixel P2 is smaller than the thickness of the light-emitting layer 170*a* of the first sub-pixel P1 and greater than the thickness of the light-emitting layer 170*c* of the third sub-pixel P3.

The fourth hole transporting layer 179 has a lower refractive index than the third hole transporting layer 173. At this time, the fourth hole transporting layer 179 can be formed of the same material as the second hole transporting layer 172. That is, the fourth hole transporting layer 179 can include the first hole transporting material.

However, the present disclosure is not limited thereto. Alternatively, the fourth hole transporting layer 179 can be omitted.

Next, the electron blocking layers (EBL) 174 on the fourth hole transporting layers 179 of the first and second sub-pixels P1 and P2 and on the third hole transporting layer 173 of the third sub-pixel P3 serve to block electrons in the light-emitting material layer 175 from moving into the third hole transporting layers 173. The electron blocking layers 174 of the first, second, and third sub-pixels P1, P2, and P3 can be connected to each other. Alternatively, the electron blocking layers 174 of the first, second, and third sub-pixels P1, P2, and P3 can be separated from each other.

For example, the electron blocking layer 174 may be selected from compounds expressed by the following Formula 16 and Formula 17, but is not limited thereto.

[Formula 16]

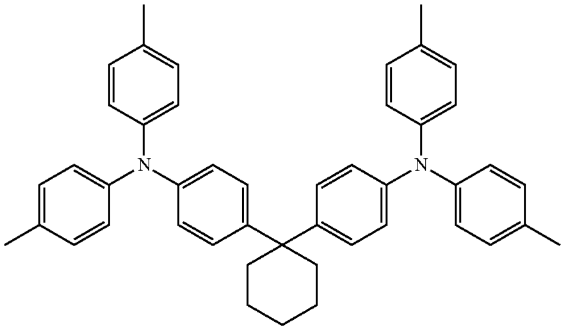

[Formula 17]

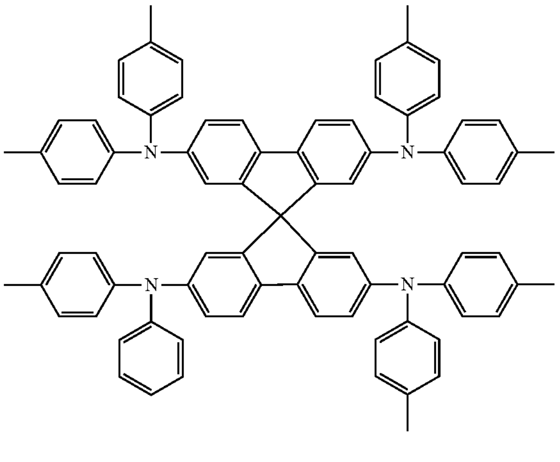

A thickness of the electron blocking layer 174 is smaller than the thickness of the second hole transporting layer 172 or the thickness of the third hole transporting layer 173.

Next, the light-emitting material layer 175 on the electron blocking layer 174 includes first, second, and third light-emitting material layers EML(R), EML(G), and EML(B) corresponding to the first, second, and third sub-pixels P1, P2, and P3, respectively.

The first light-emitting material layer EML(R) may be formed of a red luminescent material emitting red light, the second light-emitting material layer EML(G) may be formed of a green luminescent material emitting green light, and the third light-emitting material layer EML(B) may be formed of a blue luminescent material emitting blue light.

The red luminescent material may include a carbazole derivative, a fluorene derivative, an imidazole derivative, or a naphthalene derivative. The green luminescent material may include a carbazole derivative or a fluorene derivative. The blue luminescent material may include a distyryl arylene derivative, an anthracene derivative, or a pyrene derivative. However, the present disclosure is not limited thereto.

The thicknesses of the first, second, and third light-emitting material layers EML(R), EML(G), and EML(B) can be different from each other. Specifically, the thickness of the second light-emitting material layer EML(G) is smaller than the thickness of the first light-emitting material layer EML(R) and greater than the thickness of the third light-emitting material layer EML(B). However, the present disclosure is not limited thereto.

The hole blocking layer (HBL) 176 on the light-emitting material layer 175 serves to block holes in the light-emitting material layer 175 from moving into the electron transporting layer 177. The hole blocking layers 176 of the first, second, and third sub-pixels P1, P2, and P3 can be connected to each other. Alternatively, the hole blocking layers 176 of the first, second, and third sub-pixels P1, P2, and P3 can be separated from each other.

For example, the hole blocking layer 176 may be selected from compounds expressed by the following Formula 18 and Formula 19, but is not limited thereto.

[Formula 18]

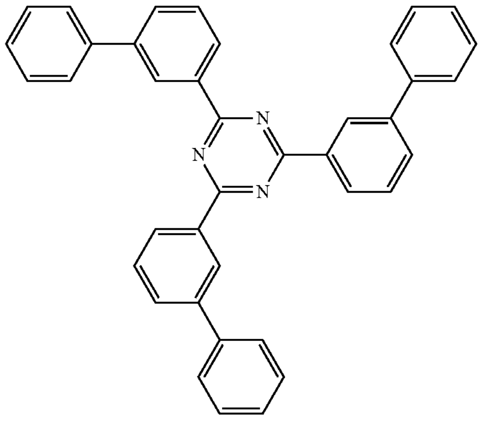

-continued

[Formula 19]

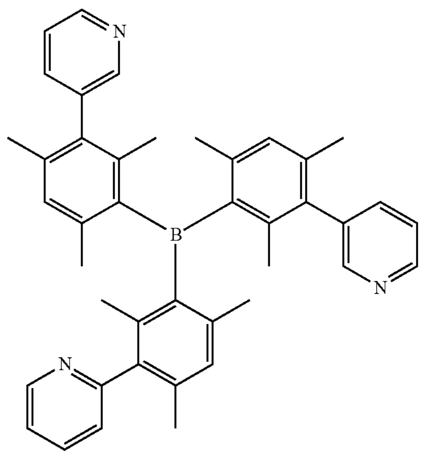

The electron transporting layer (ETL) 177 on the hole blocking layer 176 serves to smoothly transport the electrons from the second electrode 180 to the light-emitting material layer 175. The electron transporting layers 177 of the first, second, and third sub-pixels P1, P2, and P3 can be connected to each other. Alternatively, the electron transporting layers 177 of the first, second, and third sub-pixels P1, P2, and P3 can be separated from each other.

For example, the electron transporting layer 177 may include Alq3, a triazole derivative, a triazine derivative, an oxadiazole derivative, a phenanthroline derivative, a quinoxaline derivative, a fluorene derivative, or a benzimidazole derivative.

The electron injecting layer (EIL) 178 on the electron transporting layer 177 serves to smoothly inject the electrons from the second electrode 180 into the light-emitting material layer 175. The electron injecting layers 178 of the first, second, and third sub-pixels P1, P2, and P3 can be connected to each other. Alternatively, the electron injecting layers 178 of the first, second, and third sub-pixels P1, P2, and P3 can be separated from each other.

For example, the electron injecting layer 178 may include LiF, Ba, or NaF, but is not limited thereto. The electron injecting layer 178 can be omitted.

Next, the second electrode 180 is formed on the electron injecting layer 178. The second electrode 180 serves as a cathode supplying the electrons and can be formed of a conductive material having relatively low work function. The second electrode 180 can be formed substantially over the entire surface of the substrate 110.

As described above, the electroluminescent display device of the present disclosure can be the top emission type, and in this case, the second electrode 180 can have a relatively thin thickness such that light can be transmitted therethrough.

The second electrode 180 may be formed of aluminum (Al), magnesium (Mg), silver (Ag), or an alloy thereof.

Alternatively, the second electrode 180 may be formed of a transparent conductive material such as indium gallium oxide (IGO).

Meanwhile, a capping layer (CPL) 190 is formed on the second electrode 180. The capping layer 190 can be formed substantially over the entire surface of the substrate 110 like the second electrode 180.

The capping layer 190 can include a first capping layer (CPL1) 192 and a second capping layer (CPL2) 194. The first capping layer 192 can be an organic capping layer made of an organic material, and the second capping layer 194 can be an inorganic capping layer made of an inorganic material. The capping layer 190 can be omitted.

As described above, in the electroluminescent display device according to the first embodiment of the present disclosure, the light-emitting layer 170 of each of the first, second, and third sub-pixels P1, P2, and P3 includes the first, second, and third hole transporting layers 171, 172, and 173 formed of different materials, and the ratio of the total thickness d1 of the first and second hole transporting layers 171 and 172 and the thickness d2 of the third hole transporting layer 173 is configured to 1:1, so that the luminous efficiency can be improved, thereby increasing the lifetime, and the viewing angles can be improved.

In this case, the first hole transporting layer 171 includes the P-type dopant and the first hole transporting material, the second hole transporting layer 172 includes the first hole transporting material, and the third hole transporting layer 173 includes the second hole transporting material. In addition, the refractive index of the second hole transporting material is greater than the refractive index of the first hole transporting material.

Meanwhile, by adjusting the ratio of the total thickness d1 of the first and second hole transporting layers 171 and 172 and the thickness d2 of the third hole transporting layer 173, the luminous efficiency can be further increased. Such a second embodiment of the present disclosure will be described in detail with reference to FIG. 5.

Figure 5:
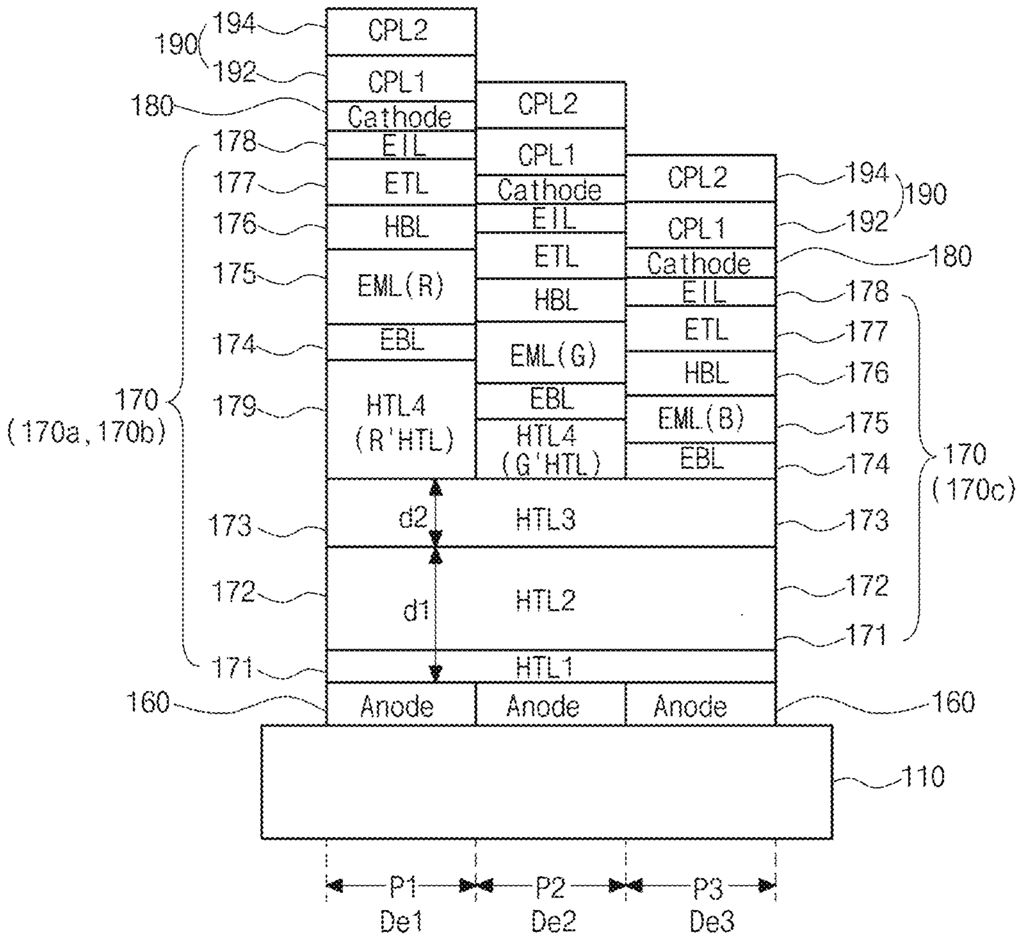
FIG. 5 is a schematic view of a pixel of an electroluminescent display device according to a second embodiment of the present disclosure.

FIG. 5 is a schematic view of a pixel of an electroluminescent display device according to a second embodiment of the present disclosure. The electroluminescent display device according to the second embodiment of the present disclosure has the same configuration as the electroluminescent display device of the first embodiment excluding the thicknesses of the first, second, and third hole transporting layers. The same parts as those of the first embodiment are designated by the same reference signs, and explanation for the same parts will be shortened or omitted.

As shown in FIG. 5, in the electroluminescent display device according to the second embodiment of the present disclosure, the sum d1 of the thickness of the first hole transporting layer 171 and the thickness of the second hole transporting layer 172 is greater than the thickness d2 of the third hole transporting layer 173. In this case, the total thickness d1 of the first and second hole transporting layers 171 and 172 and the thickness d2 of the third hole transporting layer 173 can have a ratio of about 1.8:1, but is not limited thereto.

The electroluminescent display device according to the second embodiment of the present disclosure is configured as having the total thickness d1 of the first and second hole transporting layers 171 and 172 greater than the thickness d2 of the third hole transporting layer 173, so that the luminous efficiency can be further improved. This will be described in detail below.

Table 1 shows data for a threshold voltage variation value ΔVth, operating voltage variation value ΔVd, a luminous efficiency, a lifetime, a lateral current, and a luminance drop of the electroluminescent display devices according to the first and second embodiments EM1 and EM2 of the present disclosure. In this case, each data is a relative value with respect to a first comparative example COM1. An electroluminescent display device according to the first comparative example COM1 includes a first hole transporting layer formed of the first hole transporting material and a second hole transporting layer formed of the first hole transporting material as a hole transporting layer. That is, the electroluminescent display device according to the first comparative example COM1 includes two hole transporting layers, and the first hole transporting layer of the first comparative example COM1 does not include the P-type dopant. Here, the lifetime means the relative time when the luminance is lowered to 95%, and the luminance drop indicates the luminance at a viewing angle of 45 degrees based on the luminance at the front.

Meanwhile, an electroluminescent display device according to a second comparative example COM2 includes a first hole transporting layer formed of the second hole transporting material and a second hole transporting layer formed of the second hole transporting material as a hole transporting layer, and an electroluminescent display device according to a third comparative example COM3 includes a first hole transporting layer formed of the P-type dopant and the second hole transporting material, a second hole transporting layer formed of the second hole transporting material, and a third hole transporting layer formed of the first hole transporting material as a hole transporting layer. That is, the electroluminescent display device according to the second comparative example COM2 includes two hole transporting layers, and the electroluminescent display device according to the third comparative example COM3 includes three hole transporting layers.

As described above, in the first embodiment EM1 of the present disclosure, the total thickness of the first and second hole transporting layers and the thickness of the third hole transporting layer have the ratio of 1:1, and in the second embodiment EM2 of the present disclosure, the total thickness of the first and second hole transporting layers and the thickness of the third hole transporting layer have the ratio of about 1.8:1. On the other hand, the total thickness of the first and second hole transporting layers of the first and second comparative examples COM1 and COM2 is equal to the total thickness of the first, second, and third hole transporting layers of the first and second embodiments EM1 and EM2 of the present disclosure. The total thickness of the first, second, and third hole transporting layers of the third comparative example COM3 is equal to the total thickness of the first, second, and third hole transporting layers of the first and second embodiments EM1 and EM2 of the present disclosure, and in the third comparative example COM3, the total thickness of the first and second hole transporting layers and the thickness of the third hole transporting layer have the ratio of 1:1.

decreased in comparison to the first comparative example COM1. Accordingly, the lifetime is increased. It can be seen that the lifetimes of the first and second embodiments EM1 and EM2 are increased by 15% in comparison to the first comparative example COM1. This is because the thickness of the second hole transporting layer of the first and second embodiments EM1 and EM2, which is formed of the first hole transporting material, is decreased in comparison to the thickness of the second hole transporting layer of the first comparative example COM1.

Further, it can be seen that the luminance efficiencies of the first and second embodiments EM1 and EM2 are improved in comparison to the first comparative example COM1. The luminance efficiency of the second embodiment EM2 is further improved by optimizing the thicknesses of the first, second, and third hole transporting layers.

Moreover, it can be seen that the lateral current of the second embodiment EM2 is also decreased in comparison to the first comparative example COM1. Accordingly, the gamma crush in which the grayscale expression collapses is improved, and the reliability is improved.

Additionally, it can be seen that the luminance at the viewing angle of 45 degrees of the first and second embodiments EM1 and EM2 is high in comparison to the first comparative example COM1. Accordingly, the brightness viewing angles and the distribution of the viewing angles are improved. This is because the thickness of the second hole transporting layer having the relatively low refractive index is decreased.

On the other hand, in the second and third comparative examples COM2 and COM3 compared with the first comparative example COM1, it can be seen that the threshold voltages are decreased, the luminance efficiencies are lowered, and in particular, the lateral currents are increased more than twice, so that there is a problem of reliability.

As described above, in the present disclosure, the light-emitting diode of the electroluminescent display device includes the first, second, and third hole transporting layers formed of different materials, and the total thickness of the first and second hole transporting layers is equal to or greater than the thickness of the third hole transporting layer. In this case, the first hole transporting layer includes the P-type dopant and the first hole transporting material, the second hole transporting layer includes the first hole transporting material, and the third hole transporting layer includes the second hole transporting material. Accordingly, the luminous efficiency is improved, so that the lifetime can be

TABLE 1

| | ΔVth | | | ΔVd | | | Efficiency (%) | Lifetime (%, @T95) | | | Lateral | Luminance |
|---|---|---|---|---|---|---|---|---|---|---|---|---|
| | R | G | B | R | G | B | White | R | G | B | Current (%) | Drop (%) |
| EM1 | +0.1 | +0.1 | +0.1 | −0.2 | −0.2 | −0.2 | 105 | 115 | 115 | 115 | 120 | 44 |
| EM2 | +0.1 | +0.1 | +0.1 | −0.2 | −0.2 | −0.2 | 108 | 115 | 115 | 115 | 90 | 45 |
| COM1 | 0.0 | 0.0 | 0.0 | 0.0 | 0.0 | 0.0 | 100 | 100 | 100 | 100 | 100 | 42 |
| COM2 | −0.1 | −0.1 | −0.1 | −0.3 | −0.2 | −0.2 | 97 | 110 | 110 | 110 | 350 | 45 |
| COM3 | −0.1 | −0.1 | −0.1 | −0.2 | −0.1 | −0.1 | 98 | 110 | 110 | 110 | 280 | 43 |

From Table 1, it can be seen that the threshold voltages Vth of the first and second embodiments EM1 and EM2 are improved in comparison to the first comparative example COM1. Accordingly, the black luminance is improved, and the contrast ratio is improved.

In addition, it can be seen that the operating voltages of the first and second embodiments EM1 and EM2 are increased. In addition, the reliability can be improved, and the viewing angles can be improved.

Further, by applying the fourth hole transporting layer, the light-emitting layers have different thicknesses for wavelengths emitted therefrom, so that the micro-cavity effect can be implemented, thereby further improving the luminous efficiency.

It will be apparent to those skilled in the art that various modifications and variations can be made in the electroluminescent display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An electroluminescent display device, comprising:
a substrate on which a plurality of sub-pixels are defined;
a first electrode in each sub-pixel on the substrate;
a first hole transporting layer on the first electrode;
a second hole transporting layer on the first hole transporting layer;
a third hole transporting layer on the second hole transporting layer;
a light-emitting material layer on the third hole transporting layer;
an electron transporting layer on the light-emitting material layer; and
a second electrode on the electron transporting layer,
wherein the first hole transporting layer includes a P-type dopant and a first hole transporting material, the second hole transporting layer includes the first hole transporting material, and the third hole transporting layer includes a second hole transporting material,
wherein a total thickness of the first and second hole transporting layers is equal to or greater than a thickness of the third hole transporting layer, and
wherein the first hole transporting material includes a mono-amine compound, and the second hole transporting material includes a di-amine compound.

2. The electroluminescent display device of claim 1, wherein the total thickness of the first and second hole transporting layers is greater than the thickness of the third hole transporting layer, and a ratio of the total thickness of the first and second hole transporting layers and the thickness of the third hole transporting layer is 1.8:1.

3. An electroluminescent display device, comprising:
a substrate on which a plurality of sub-pixels are defined;
a first electrode in each sub-pixel on the substrate;
a first hole transporting layer on the first electrode;
a second hole transporting layer on the first hole transporting layer;
a third hole transporting layer on the second hole transporting layer;
a light-emitting material layer on the third hole transporting layer;
an electron transporting layer on the light-emitting material layer; and
a second electrode on the electron transporting layer,
wherein the first hole transporting layer includes a P-type dopant and a first hole transporting material, the second hole transporting layer includes the first hole transporting material, and the third hole transporting layer includes a second hole transporting material,
wherein a total thickness of the first and second hole transporting layers is equal to or greater than a thickness of the third hole transporting layer, and
wherein the second hole transporting material has a higher refractive index than the first hole transporting material.

4. The electroluminescent display device of claim 3, wherein the second hole transporting material has a refractive index of 2.1 or more at a wavelength of 460 nm.

5. The electroluminescent display device of claim 1, wherein the first hole transporting material is selected from compounds expressed by following formulas:

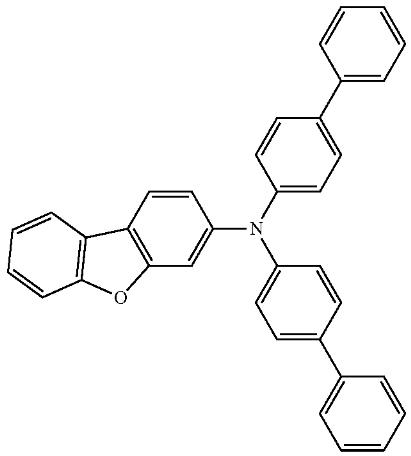

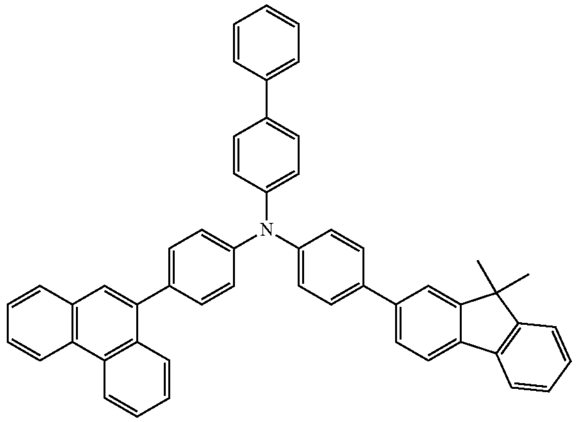

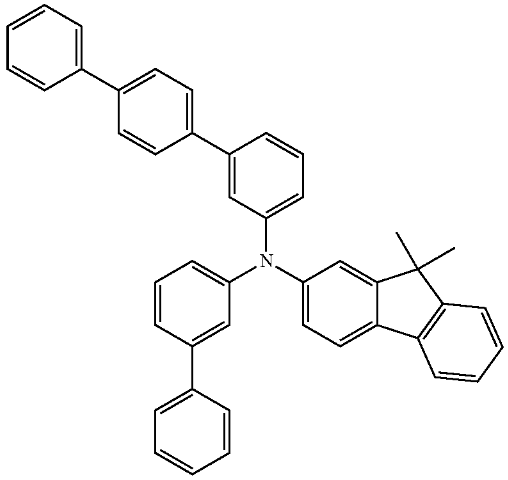

-continued
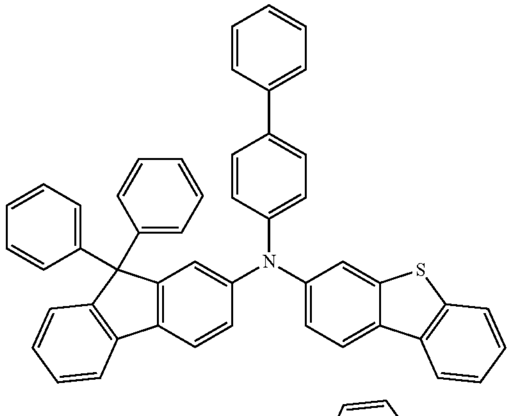
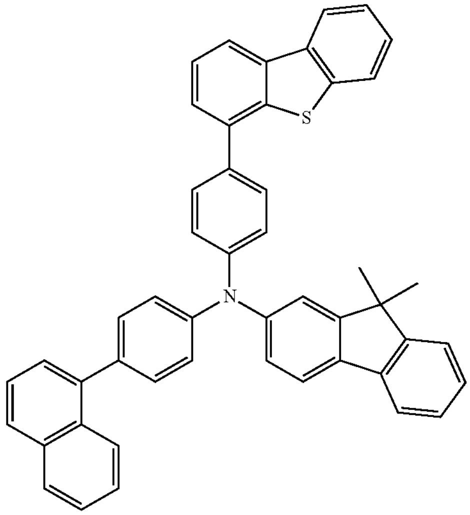
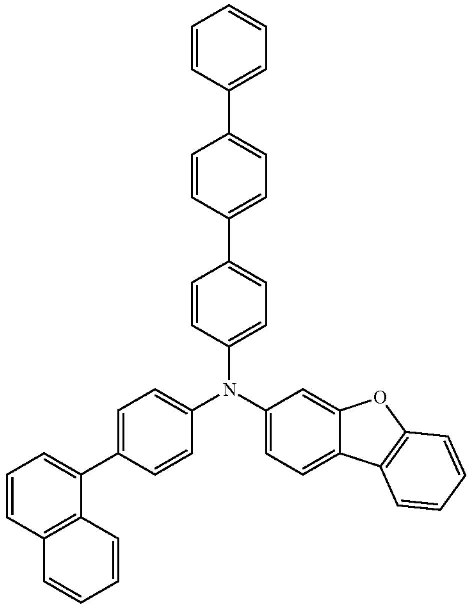
-continued
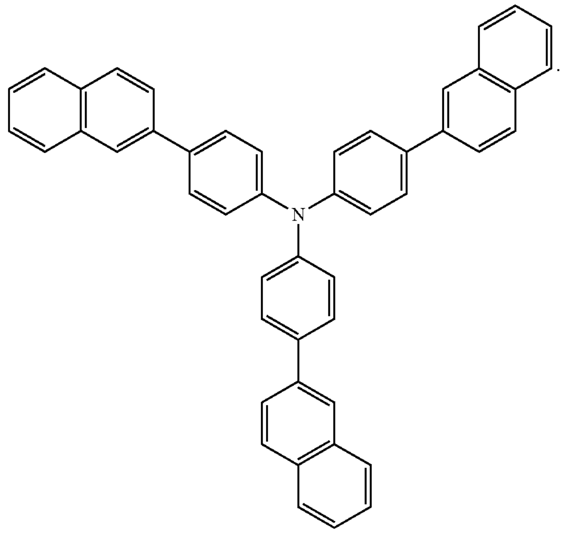 [SMILES: c1ccc2cc(-c3ccc(N(c4ccc(-c5ccc6ccccc6c5)cc4)c4ccc(-c5ccc6ccccc6c5)cc4)cc3)ccc2c1]
6. The electroluminescent display device of claim 1, wherein the second hole transporting material is selected from compounds expressed by following formulas:
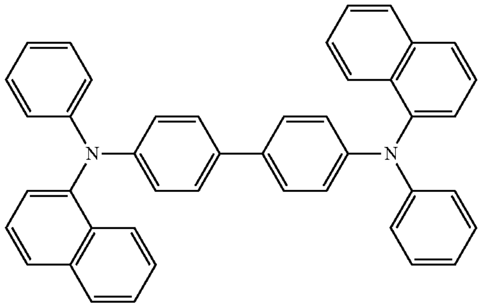
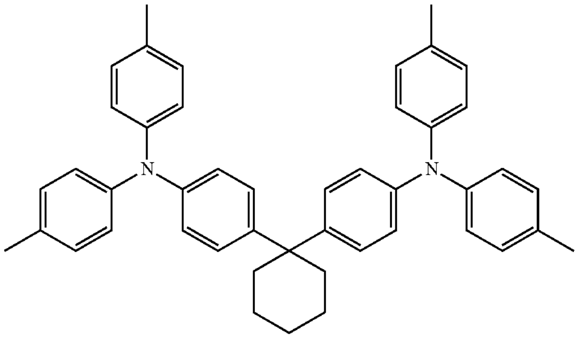

-continued

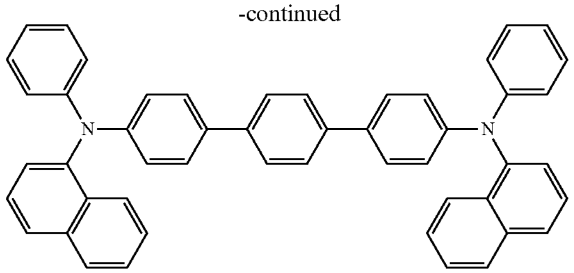

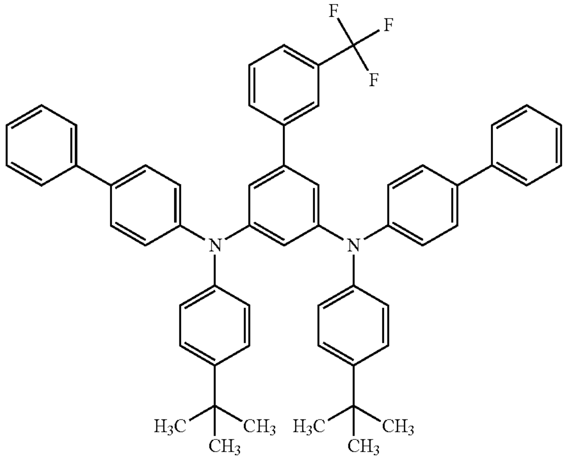

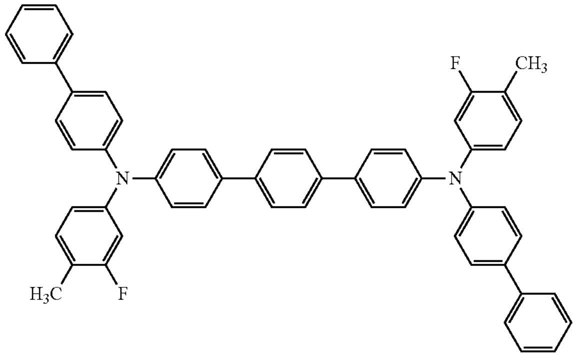

-continued

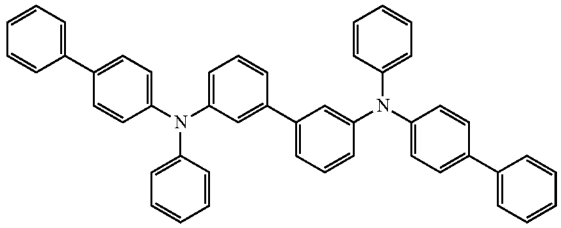

.

7. The electroluminescent display device of claim 1, wherein the plurality of sub-pixels include first, second, and third sub-pixels, wherein a fourth hole transporting layer is further provided between the third hole transporting layer and the light-emitting material layer in each of the first and second sub-pixels, and wherein the fourth hole transporting layer includes the first hole transporting material.

8. The electroluminescent display device of claim 1, further comprising:

an electron blocking layer between the third hole transporting layer and the light-emitting material layer; and a hole blocking layer between the light-emitting material layer and the electron transporting layer.

9. The electroluminescent display device of claim 8, further comprising an organic capping layer and/or an inorganic capping layer on the second electrode.

10. The electroluminescent display device of claim 7, wherein a thickness of the fourth hole transporting layer of the first sub-pixel is greater than a thickness of the fourth hole transporting layer of the second sub-pixel.

11. The electroluminescent display device of claim 1, wherein the mono-amine compound contains one N atom, and the di-amine compound contains two N atoms.

* * * * *